United States Patent [19]
Estes et al.

[11] Patent Number: 5,459,001
[45] Date of Patent: Oct. 17, 1995

[54] LOW STRESS ELECTRODEPOSITION OF GOLD FOR X-RAY MASK FABRICATION

[75] Inventors: Scott A. Estes, Essex; Thomas B. Faure, Georgia; Steven C. Nash, Essex Junction, all of Vt.

[73] Assignee: International Business Machines Corporation, Armonk, N.Y.

[21] Appl. No.: 207,834

[22] Filed: Mar. 8, 1994

Related U.S. Application Data

[62] Division of Ser. No. 927,700, Aug. 7, 1992, Pat. No. 5,318,687.

[51] Int. Cl.$^6$ ................................................. G03F 9/00
[52] U.S. Cl. ..................... 430/5; 430/322; 430/324; 378/34; 378/35
[58] Field of Search ........................... 430/5, 322, 324; 378/34, 35

[56] References Cited

U.S. PATENT DOCUMENTS

| | | | |
|---|---|---|---|
| 4,468,799 | 8/1984 | Harms et al. | 378/35 |
| 4,515,876 | 5/1985 | Yoshihara et al. | 430/5 |
| 4,647,517 | 3/1987 | Hersener et al. | 430/5 |
| 4,698,285 | 10/1987 | Ehrfeld et al. | 430/5 |
| 4,873,162 | 10/1989 | Yoshioka et al. | 430/5 |
| 4,946,751 | 8/1990 | Bruns et al. | 430/5 |
| 4,998,267 | 3/1991 | Lee et al. | 378/35 |
| 5,057,388 | 10/1991 | Yahalom | 430/5 |
| 5,096,791 | 3/1992 | Yahalom | 430/5 |
| 5,266,183 | 11/1993 | Dauksher et al. | 205/266 |

FOREIGN PATENT DOCUMENTS

| | | |
|---|---|---|
| 0025220A1 | 3/1981 | European Pat. Off. |
| 0536635A1 | 10/1993 | European Pat. Off. |
| 1430799 | 4/1976 | United Kingdom. |

OTHER PUBLICATIONS

Chu et al. "Low Stress Electroplating For X-ray Masks" *Microelectronic Engineering* 17, pp. 3324–3226, (1992). (Jun. 1992).
Nash et al. "H-ray Mask Process-Induced Distortion Study" *J. Vac. Sci. Technol.* B9 (6), pp. 3324–3328, (1991). (Nov. 1991).
Sel-Rex Technical Data Sheet, Nov. 1988. (May 1988).
Becker et al. "A High Resolution Dimensional Metrology Syustem for Masks" *SPIE* 775, pp. 120–125, (1987). (Mar. 1987).
Armitage et al. "Analysis of Overlay Distortion Patterns" *SPIE*, 921, pp. 207–222, (1988). (Mar. 1988).
Chiu et al. "Electrodeposition of Low Stress Gold for X-ray Mask" *J. Vac. Sci. Technolo.* B8 (6), pp. 1589–1594, (1990). (Nov. 1990).
Ogawa et al. "Stress-Controlled X-ray Mask Absorber Using Pulse-Current Gold Plating" *J. Vac. Sci. Technol.* B10 (3), pp. 1193–1196, (1992). (Jun. 1992).

*Primary Examiner*—S. Rosasco
*Attorney, Agent, or Firm*—Heslin & Rothenberg

[57] ABSTRACT

An electrodeposition process for producing gold masks for X-ray lithography of integrated circuits is disclosed. The process produces a gold layer of tightly controlled grain size and arsenic content which results in minimum stress in the gold film and therefore minimum distortion in the features produced from the mask. The process comprises (a) immersing a substrate in a solution containing from 6 to 9 grams of gold per liter and from 8 to 30 mg of arsenite per liter, and (b) passing an electric current having a current density of 1 to 5 mA per cm$^2$ through the solution to cause electrodeposition of gold.

9 Claims, 6 Drawing Sheets

⊢ 0.02 μm 0.02 μm

LOW STRESS ELECTRODEPOSITION OF GOLD FOR X-RAY MASK FABRICATION

This application is a division of application Ser. No. 07/927,700, Aug. 7, 1992 now U.S. Pat. 5,318,687.

TECHNICAL FIELD

The invention relates to an electrodeposition process for producing gold masks for X-ray lithography of integrated circuits. The process produces a gold layer of tightly controlled particle size and arsenic content which results in minimum in plane distortion in the gold film and therefore minimum distortion in the features produced from the mask.

BACKGROUND ART

The manufacture of high density, narrow line width integrated circuits requires the use of high resolution lithography equipment. The early photolithographic techniques used ultraviolet or natural light to expose the patterns on the wafer. However, ultraviolet and natural light techniques have resolution limitations. In particular, diffraction, interference, and light divergence are common; they cause a reduction in resolution and they limit the circuit yield per wafer. In the case of very complex integrated circuits (e.g. VLSI), the size of the components forming the circuits approaches the wavelengths used to produce the masks (around 1 μm) and large geometric errors can thereby arise. The resolution ultimately obtained in the resist is thus limited by, among other factors, the wavelength of the incident light.

In part because of these disadvantages, X-ray lithography was developed to take advantage of the shorter wavelengths of soft X-rays to expose appropriate patterns in the resists. The wavelength of the X-rays, which generally ranges from about 0.1 to 1.0 nanometers, significantly improves the resolution and circuit yield per wafer associated with lithography.

During X-ray lithography, an X-ray source such as a synchrotron is used to direct an intense collimated beam of X-rays through an X-ray mask overlying a photoresist layer of a semiconductor wafer. The mask includes a central, X-ray transparent region with selected patterns formed of X-ray absorbing material. The X-rays expose patterns on the underlying photoresist layer that correspond to the apertures in the mask formed by the X-ray absorbing material. The resist layer is then developed in the normal fashion to provide a pattern on the surface of the semiconductor wafer. X-ray lithography offers the advantages of improved resolution combined with a large depth of field, vertical walled patterns, and simplicity in forming the circuit patterns on the semiconductor wafers.

As materials for absorber patterns, it is required to use materials which sufficiently absorb soft X-rays. If the wavelength of a soft X-ray is determined, the quantities of soft X-rays absorbed by an X-ray absorber can easily be calculated based on an X-ray absorption coefficient. Elements of higher atomic numbers such as gold, tantalum, tungsten, rhenium or the like must be used in order to obtain an X-ray attenuation of the order of 10 dB, so that a sufficient degree of mask contrast is attained.

In practice, only gold is commonly used as an absorber material. When Ta, W, Re or the like, which have high melting points, are deposited in the form of thin films, high stresses are produced so that the thin mask substrate is damaged and distorted. Therefore, gold, which is relatively easily processed, is preferred. When gold is used as an absorber material, the gold film must have a thickness of about 0.52 μm for Al—K radiation (8.34 Å), about 0.68 μm for Si—K radiation (7.13 Å) and about 0.20 μm for Cu—L radiation (13.2 Å) in order to obtain a mask contrast of 10 dB.

There are two conventional processes for providing gold absorbers. In one process, an insulating film is defined to form an electroplating mask and gold is plated on the mask substrate. The other process, not of interest here, is the ion etching method. The former process, in which fine gold patterns are electroplated through a mask of insulating material, can produce submicron patterns having steep profiles. control of the plating process is essential for repeatably achieving high-quality absorber films with low in-plane distortion.

The characteristics of the plated Au films can affect the x-ray mask in the following ways: (1) Stress of the film—films plated under high stress may delaminate from the substrate. They may also distort the mask membrane. (2) Plating uniformity—the thickness of the film should be the same across the entire plated area. (3) Morphology—it is desirable to keep the grain size small and surface roughness at a minimum in the plated films. Otherwise, thickness variations can produce excessive and variable x-ray attenuation across a particular pattern. (4) Reproducibility—plating results should be reproducible from run to run.

The use of arsenite ($AsO_2^-$) in gold plating baths is known. Sel-Rex® BDT® 510 gold electroplating process solution (OMI International Corp., Nutley, N.J.) is an example of a plating solution based on the gold sulfite anion complex. The manufacturer's recommendation is to use 10 mL of "brightener" solution per gallon of gold plating solution. The nature of the brightener solution is not disclosed in the manufacturer's technical data sheet for BDT® 510; arsenic analysis indicates that it contains sufficient $AsO_2^-$ to provide 58 μg/mL of $AsO_2^-$ in the final plating solution. We have found that 58 μg/mL produces films that exhibit much too high tensile stress for submicron rule integrated circuits. (See FIG. 9 below)

Thus there is a need for a gold deposition process that reproducibly provides a uniform layer of sufficient thickness (0.6 to 0.7 μm) and morphology to provide reasonable contrast but without high stress.

DISCLOSURE OF INVENTION

It is an object of the invention to provide a process for reproducibly electrodepositing a gold layer having low stress.

It is a further object to provide an x-ray mask having a patterned gold surface wherein the gold pattern is under minimal stress and thereby introduces minimal distortion.

In one aspect the invention relates to an electrodeposition process for producing a low-stress gold layer comprising the steps of:

(a) immersing a substrate in a solution containing both gold and arsenite ion, said solution containing from 6 to 9 grams of gold per liter and from about 8 to about 30 mg of arsenite per liter, a surface of said substrate having an electrically conductive portion in contact with said solution, and (b) passing an electric current through said conductive portion and said solution to cause electrodeposition of gold on said electrically conductive portion of said substrate, said current having a current density of 1 to 5 mA per cm² of conductive surface in contact with said solution.

A preferred solution of gold (I) is a sulfite-based solution at pH 8.5 to 9.0 and a preferred current density is from 2 to 4 mA per cm². The process is preferably carried out such that gold is deposited on the electrically conductive surface at a rate of about 0.19 μm per minute.

In a further aspect the invention relates to an X-ray mask produced by the above process.

In a further aspect the invention relates to an X-ray mask comprising:

(a) an X-ray transparent substrate; and (b) an X-ray absorbing layer, said absorbing layer comprising a mixture of from 0.080 to 0.175 atom percent of arsenic in gold.

The absorbing layer is preferably 0.6 to 0.7 μm thick. In one embodiment the X-ray transparent layer comprises polyimide.

In a further aspect the invention relates to an x-ray mask comprising:

(a) an X-ray transparent substrate; and (b) an X-ray absorbing layer, said absorbing layer comprising gold of mean grain size from 0.3 μm to 1.5 μm. The X-ray absorbing layer is preferably from 0.6 to 0.7 μm thick, of mean grain size from 0.4 to 0.9 μm and in one embodiment is deposited on a polyimide substrate.

In a further aspect the invention relates to an electrodeposition process for producing a low-stress gold layer comprising the steps of:

(a) immersing a substrate in a solution containing both gold and arsenite ion, a surface of said substrate having an electrically conductive portion in contact with said solution, and (b) passing an electric current through said conductive portion and said solution to cause electrodeposition of gold on said electrically conductive portion of said substrate, said process characterized in that the concentrations of gold and arsenite and the current density are selected so that in-plane distortion as a result of the deposition process is less than 35 nm.

In yet a further aspect the invention relates to a process for creating a pattern on a substrate comprising:

(a) providing an X-ray mask having a patterned gold surface comprising a mixture of from 0.080 to 0.175 atom percent of arsenic in gold;

(b) aligning the mask on the resist-coated substrate;

(c) exposing the mask and resist to a beam of X-rays; and (d) developing the resist.

A related process comprises:

(a) providing an X-ray mask having a patterned gold surface wherein said gold is of mean grain size from 0.3 μm to 1.5 μm;

(b) aligning the mask on the resist-coated substrate;

(c) exposing the mask and resist to a beam of X-rays; and (d) developing the resist.

BEST MODE FOR CARRYING OUT THE INVENTION

Figure 1:
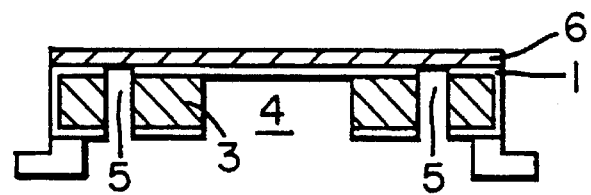
FIG. 1 is a cross-section of an X-ray mask substrate before patterning and electrodeposition.

FIGS. 1 through 6 illustrate the construction of an X-ray mask for IC fabrication. In FIG. 1 a heavily boron-doped silicon membrane 1 of about 2.5 μm thickness has been prepared by conventional means and is supported on a Pyrex® ring 2. The remains 3 of the silicon wafer from which it was constructed are seen under the membrane outside the mask window 4 and the alignment windows 5. A layer of polyimide 6 approximately 1.7 μm thick has been laid down as a substrate upon which the gold pattern will be deposited. Although polyimide was used as a blanket layer in the examples which follow, its use as the substrate is not required for the practice of the process of the invention. The mask could be constructed directly on the silicon membrane or on other common membranes such as silicon nitride, silicon carbide, boron nitride, boron carbide, or carbon (diamond), which would then become the substrate as the term is used herein. In addition one could envision other polymers than polyimide being used as a blanket layer.

Figure 2:
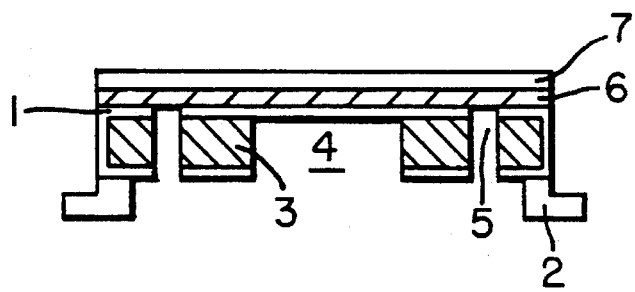
FIG. 2 is a cross section of an X-ray mask after deposition of the contact layer.
Figure 3:
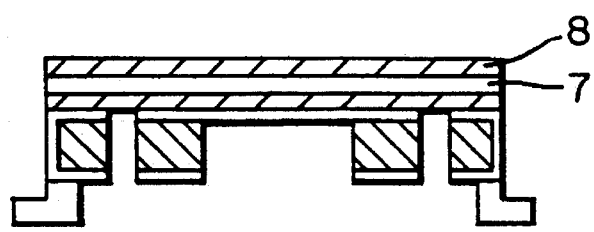
FIG. 3 is a cross-section of an X-ray mask after application of resist.
Figure 4:
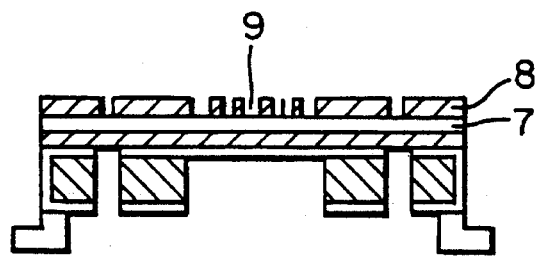
FIG. 4 is a cross-section of an X-ray mask after developing the resist.
Figure 5:
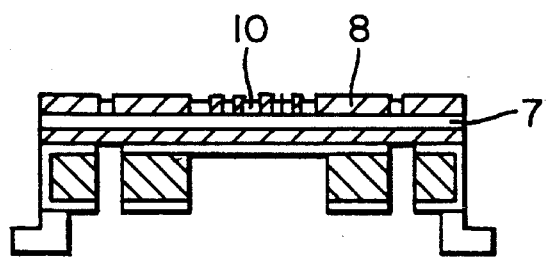
FIG. 5 is a cross-section of an X-ray mask after electrodeposition of gold.
Figure 6:
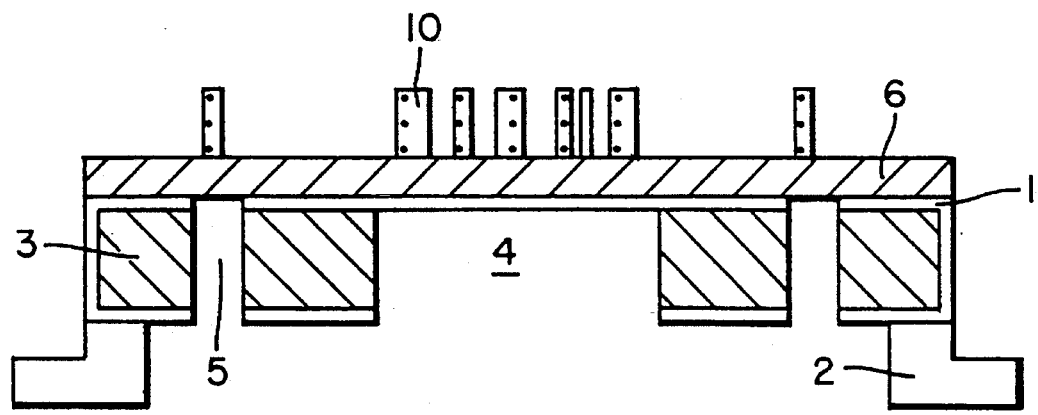
FIG. 6 is a cross-section of an X-ray mask after stripping the resist and the contact layer.

In any case, a conductive layer or plating base 7 must be deposited as shown in FIG. 2 (and subsequently removed from the unmasked areas as shown in FIG. 6 below) to act as the cathode during electrodeposition. The plating base is commonly evaporated onto the substrate as a bilayer composed of about 0.005 μm of chromium and about 0.03 μm of gold. An E-beam resist 8 is spun on top of plating base 7 as shown in FIG. 3. The E-beam resist 8 can be made of any of the common resist materials well known in the art. Typically a novolak resin about 0.7 to 0.8 μm thick would be used. Using an E-beam tool the chip pattern is written on the resist and the exposed areas are developed in the usual fashion to provide a pattern 9 extending through to the plating base 7 as shown in FIG. 4.

Gold is electrodeposited according to the process of the invention to fill in the pattern 9 with gold 10 to a depth of slightly less than the height of the resist. In the case shown in FIG. 5, where the resist is 0.7 to 0.8 μm thick, the gold will typically be 0.5 to 0.7 μm thick. It is important, as discussed above, that the deposition be uniform so that there are not areas of the pattern where the gold is so thin as to be inadequate to provide high contrast or so thick that the gold spills out or "bread-loafs" over the top of the resist.

The resist 8 is stripped as shown in FIG. 6 by conventional means such as $O_2$ plasma or wet strip with KOH. The plating base 7 is also stripped in the exposed areas by conventional means, such as sputtering to produce an x-ray mask according to the invention as shown in FIG. 6.

Turning now to the details of the electrodeposition process, gold plating has been practiced for decorative purposes for over a hundred years. Its use in the electronics industry is a rather recent development. Although a number of solutions of gold compounds have been proposed in the electrodeposition literature, only cyanide and sulfite based solutions are widely used today. The sulfite bath was introduced in the 1960's to overcome the environmental hazards posed by the cyanide bath. For that reason, a sulfite plating solution is preferred in the process of the invention, but there is no reason, priori, that cyanide would not behave similarly.

Because of the nobility of gold, aqueous solutions of its ions (+1 or +3) can be obtained only by using complexing agents, e.g., $CN^-, SO_3^{-2}$. The equilibrium constants of these gold (I) complexes used in commercial plating baths are:

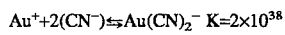

Cyanide ion is a stronger complexing agent than sulfite ion, and wide ranges of pH are available for cyanide electrodeposition baths. These are usually classified as acid (pH=3–6), neutral (pH=6–8), and alkaline (pH=8.5–13). The current efficiency of cyanide baths is generally between 90 and 100%. On the other hand, for the sulfite bath, only a pH greater than 8 can be used reliably. An alkaline solution is required to prevent the formation of dithionate ion, $S_2O_4^-$ which reduces the gold complex to metallic gold. 100% current efficiency is usually achieved with sulfite baths.

The stress of gold films electrodeposited from cyanide baths has been reported to vary from less than $10^8$ to $27 \times 10^8$ dynes/cm$^2$. For sulfite solutions, ranges from less than $10^8$ to $24 \times 10^8$ are reported. Most of these results were obtained using proprietary solutions, and the exact solution composition and details of the experiments are not documented. Therefore, no meaningful correlations between stress and composition can be made among the reported results. In particular the window of low stress deposition cannot be determined. For the fabrication of ULSI circuits the maximum in plane error should be less than 0.1 μm.

We have discovered that the addition of arsenite, known as a "brightener", in a specific and rather narrow range of proportions, combined with deposition at a specific and narrow range of current density and control of the other plating solution parameters leads to the reproducible deposition of low-stress, gold films. These films can be deposited in the proper 0.6 to 0.7 μm thickness without introducing a level of stress that would cause unacceptable distortion of the mask during subsequent processing or use.

Figure 10:
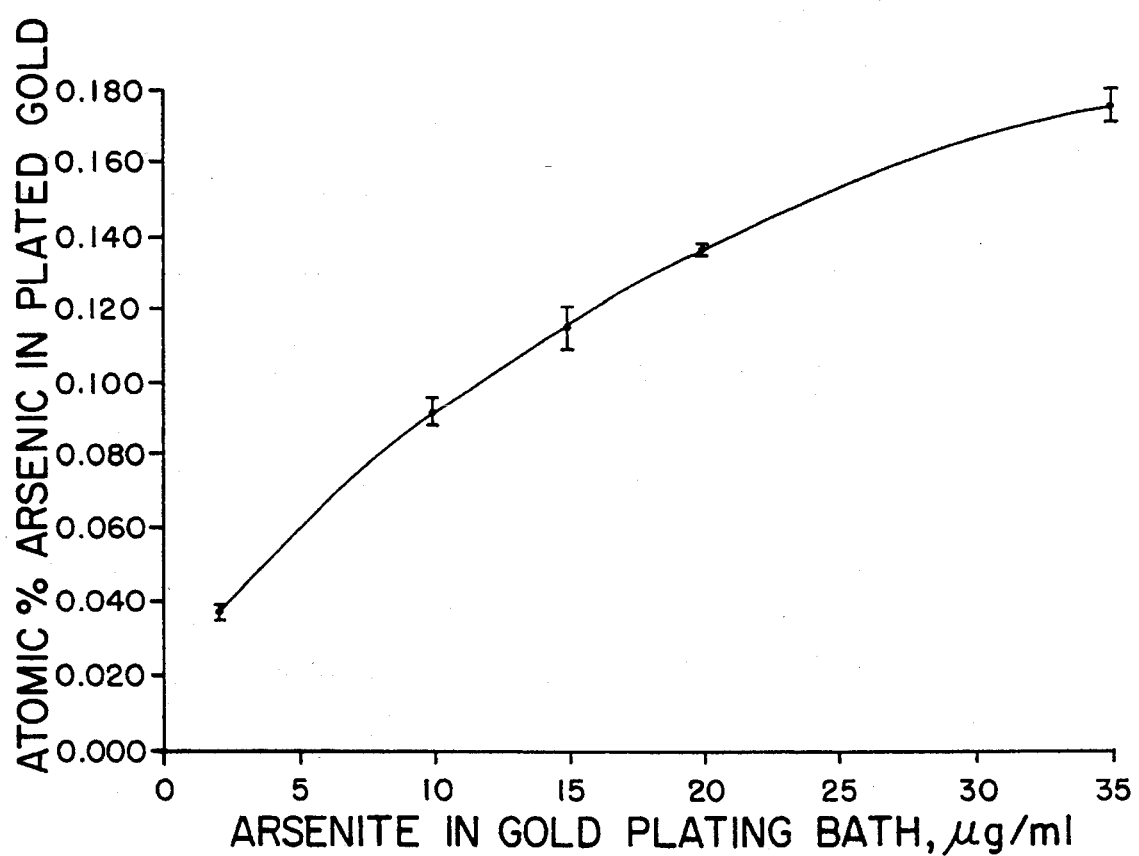
FIG. 10 is a graph of atom % As in the plated Au as a function of $AsO_2^-$ concentration in the plating bath.

The role of arsenite in the plating solution is believed to be that of modulating the grain size of the gold in the electrodeposited film. In principle, any source of arsenic that, at the electrode potential and current density being used, would plate out arsenic in the proper amount to obtain the correct grain size of gold would be operable in the invention; in practice, only arsenite ($AsO_2^-$) appears at present to be a practical source of arsenic that meets the necessary constraints. FIG. 10 shows the empirically determined correlation between arsenic levels in the plated gold and arsenite concentration in the plating bath. The relationship is not quite linear and in the optimum films the atom % of arsenic is from about 0.080 to about 0.175. Other elements are also reported to function as brighteners for gold plating baths: Cd, Mo, W, Ti, Pb, Zn, Fe, In, Sn, Ni, Co, Cu, Mn, V, Tl, Sb, Se and Te. It may be assumed that appropriate salts or complexes of these elements could also be used to provide gold of the proper grain size to minimize stress.

We have found that low-stress films require that the electrodeposited gold have a mean grain size of 0.3 μm to 1.5 μm, preferably 0.4 μm to 0.9 μm. Grain size, as the term is used herein, refers to the longest dimension of a grain when measured in the plane of the film. Thus the preferred grains of gold are from 0.6 to 0.7 μm "high" (from the perspective of FIGS. 1 to 6) and from 0.4 to 0.9 μm average "width" (from that same perspective). This is achieved, as stated above, by electroplating a sulfite based gold solution at pH 8.5 to 9.0 containing 8 to 30 mg of $AsO_2^-$ per liter at 1 to 5 mA/cm$^2$. In addition, it is advantageous to monitor and maintain the free sulfite concentration between 0.05 and 0.5M, although low stress films can still be deposited as long as there is some free sulfite and the $AsO_2^-$ and pH are maintained at their proper levels. Because the arsenite anion concentration in the bath is depleted by reduction to arsenic in the deposit and by oxidation to arsenate at the anode, it is important to monitor the arsenite concentration in the plating bath frequently and precisely. The concentration of Au(I) can be from 5 to 15 g/L and preferably from 6 to 9 g/L; it is commonly provided in the form of sodium gold sulfite, $Na_3Au(SO_3)_2$. Low current density gives the best uniformity; high current density gives the least stress. Since both uniformity and stress are important, a window of current density for optimal films occurs between 1 and 5 mA/cm$^2$ preferably 2 to 4, most preferably 3 mA/cm$^2$.

A series of X-ray masks e-beam patterned with an "All Gold" test pattern were used to assess mask distortion. The masks simulate a device contact layer pattern in which more than 95% of the central 25 mm×25 mm membrane is plated with gold. The X-ray mask substrate used in these experiments consisted of a 2.5 μm boron-doped silicon membrane covered by a 1.7 μm thick layer of polyimide. This, in turn, was coated with a 0.035 μm chrome/gold plating base as shown in FIGS. 1 and 2. The experimental process flow was as follows:

1. After developing the 0.8 μm thick novolak beam resist pattern in 0.23N potassium hydroxide, an initial measurement of the in-plane distortion of the resist pattern was taken using a Leica LMS 2000 tool.

2. Next, the masks were plated with 0.6 to 0.7 μm of gold under different current density and brightener concentration conditions using a commercially available non-cyanide gold plating bath (Sel-rex BDT 510). The electrolyte in this bath was an alkaline sodium gold sulfite solution with a pH of 8.5. The gold was present in the solution in the +1 oxidation state. The brightener additive in the bath was arsenite anion that would plate out as arsenic into the gold deposit. The brightener concentration in the bath was varied from 1–45 mg/L and was monitored using ion chromatography on a sulfonated polystyrene column (HPICE-AS1, Dionex Corp., Sunnyvale, Calif.) with electrochemical detection. Current densities of 2, 3, and 4 mA/cm$^2$ were studied and controlled using a Princeton Applied Research model 363 Potentiostat/Galvanostat. The plating bath temperature was kept at 20°–23° C. Thickness of the plated gold deposits was measured using a Tencor P-1 profilometer.

3. After electrodeposition of the gold and before stripping the e-beam resist, another measurement of in-plane pattern distortion was performed using the Leica LMS 2000 tool.

An APL2-based program was used to perform the data analysis. The electroplating-induced distortion was computed by first performing a vector subtraction, point by point, of the measurements before and after the gold-plating process step. A least-squares fit was performed, using measurement sites that were not on the membrane to remove translation and rotation errors underneath. Then the translation and rotation found above was removed for the measurement sites on the membrane. This technique basically aligned the two distortion measurements, before and after plating, on top of each other. Lastly the mean-plus-3-sigma residual for the measurement sites on the membrane was used as the measure of the electroplating-induced distortion.

The experimental setup used for in-plane distortion measurement is described by Becker et al. in *SPIE Proceedings* vol. 775, 120–125 (1987) which is incorporated herein by reference. The instrument used was a Leitz LMS 2000™ laser metrology system (Rockleigh, N.J.). The LMS 2000 consists of an x-y stage and a laser metrology system for tracking the stage position. A scanning slit technique is used to scan the target on the x-ray mask with a rectangular light beam. The LMS 2000 uses the 546 nm line of a non-coherent mercury/xenon light source for illumination of the scanning slit. The profile is the intensity of the reflected light through a long working distance 100× objective (n.a. of 0.08). The location of the scanning mirror is monitored by an interpolated grating system. The combination of stage position and mirror position give the relative location of the measurement target on the mask. The LMS 2000 has two edge-detection algorithms available. The standard algorithm uses a threshold technique, where the edge is defined as, for example, the 50% crossover point of a profile. The wafer algorithm looks for the drop in the signal caused by scattering of the light at the edges. The minimum point in the profile is defined as the edge.

Figure 7:
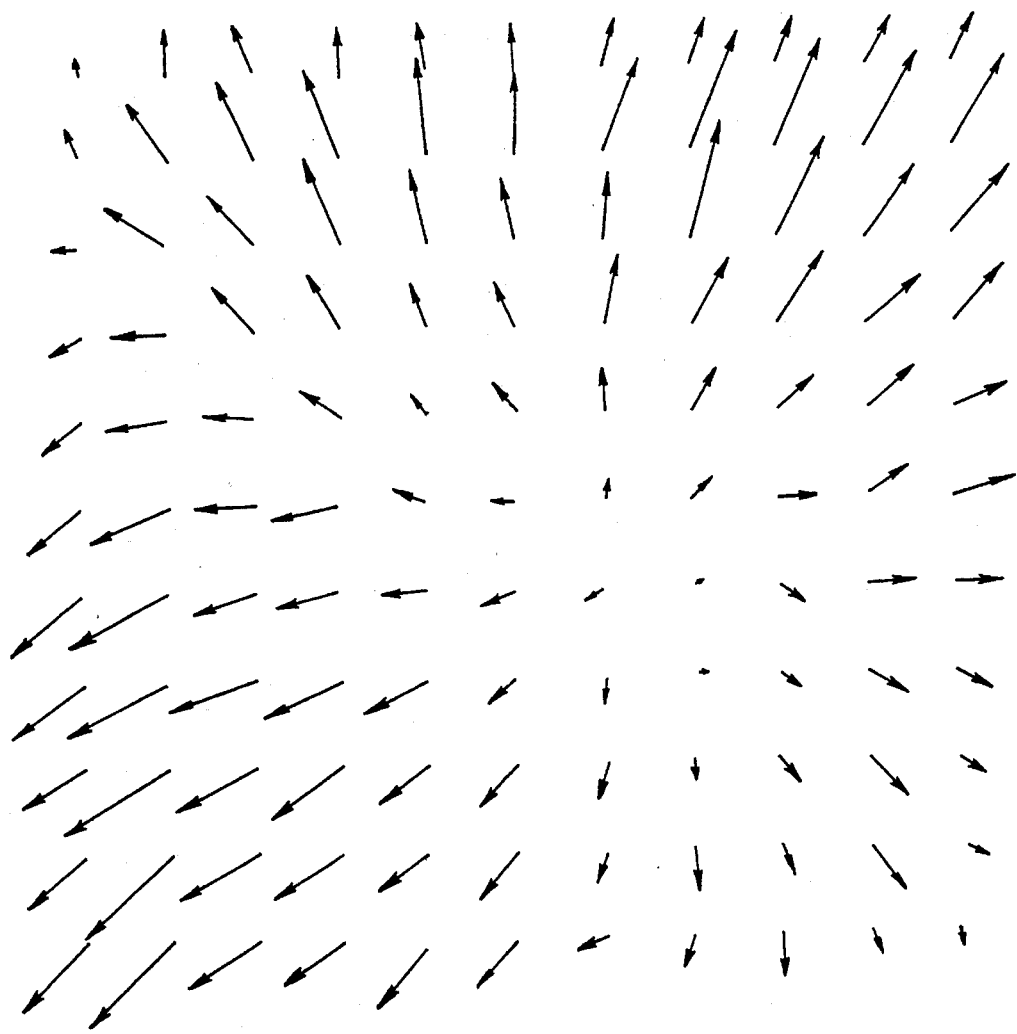
FIG. 7 is a diagram of in-plane mask distortion caused by stress in a gold layer produced by a process having less than 8 mg/L of arsenite in the plating bath.

FIG. 7 shows the in-plane distortion caused by compressive stress from deposition at 3 mA/cm² (0.19 μm/min) and $AsO_2^-$ conc. of 5 mg/L. The distortion is 97 to 110 nm (mean plus 3 σ). From other experiments not shown, the stress was shown to be relatively independent of the current density in the range described above (1–4 mA/cm²) when the level of $AsO_2^-$ is 5 mg/L.

Figure 8:
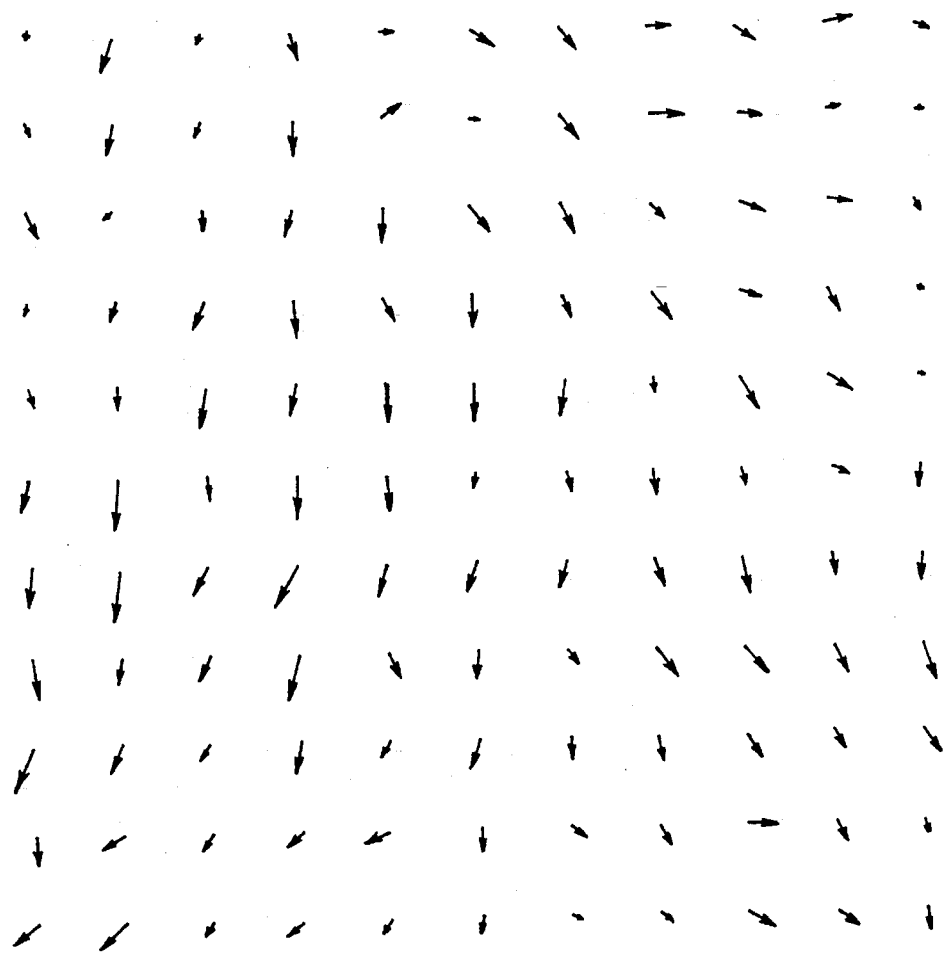
FIG. 8 is a diagram of in-plane mask distortion caused by stress in a gold layer produced according to the inventive process.

FIG. 8 shows the low stress film of the invention deposited at 15 mg/L and 3 mA/cm². The distortion is about 30 nm (mean plus 3 σ) which is within the measurement noise of the LMS 2000 (35 nm).

Figure 9:
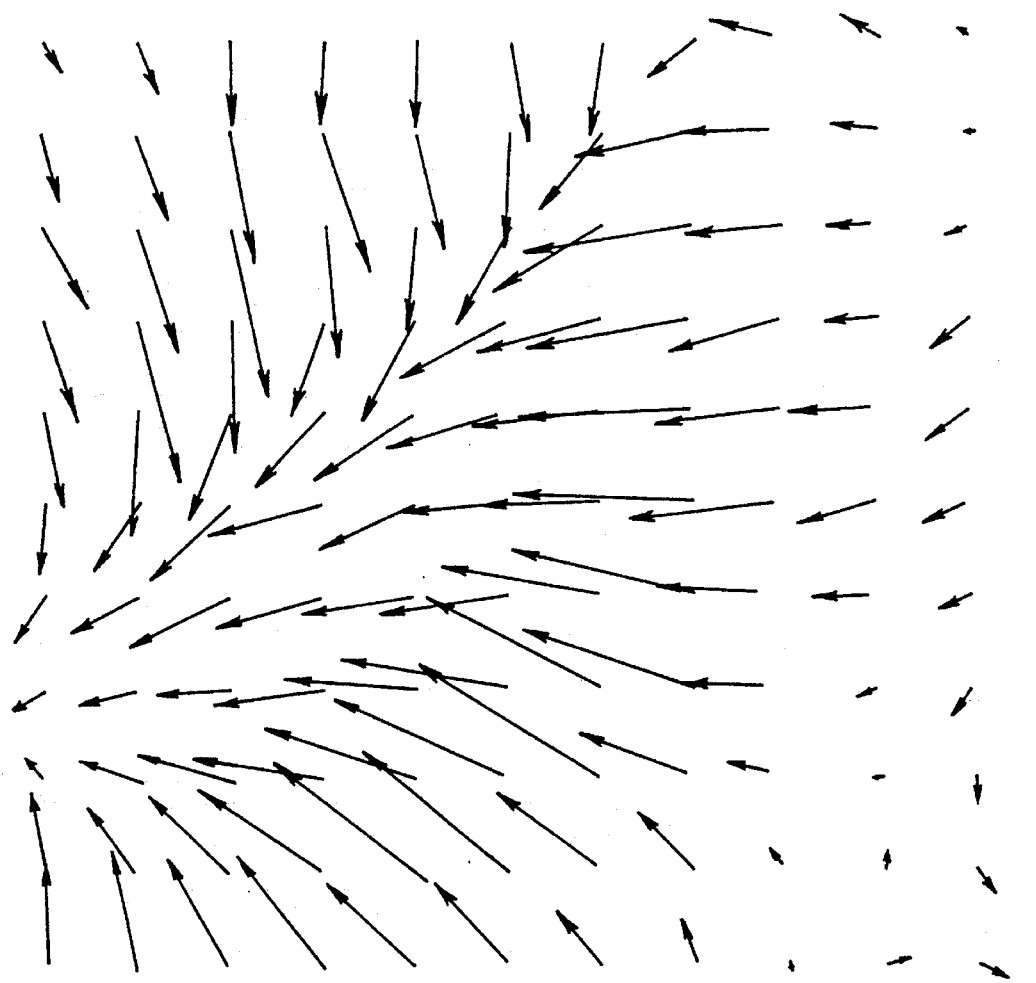
FIG. 9 is a diagram of in-plane mask distortion caused by stress in a gold layer produced by a process having more than 30 mg/L of arsenite in the plating bath.

FIG. 9 shows the in-plane distortion caused by tensile stress where the level of $AsO_2^-$ is raised to 35 mg/L and the current density held at 3 mA/cm². The distortion is about 100 to 120 nm. From other experiments not shown, the tensile stress is relatively independent of the current density in the range described above when the level of $AsO_2^-$ is held at 35 mg/L. In all of FIG.'S 7 to 9 one centimeter equals 0.04 μm.

While the invention has been particularly shown and described with reference to preferred embodiments thereof, it will be understood by those skilled in the art that other changes in form and details may be made therein without departing from the spirit and scope of the invention. In particular, although the invention is illustrated in the production of gold X-ray masks, the process can be applied in any field where low-stress gold films are required.

We claim:

1. An X-ray mask comprising:
   (a) an X-ray transparent substrate; and
   (b) an X-ray absorbing layer, said absorbing layer comprising a mixture of from 0.080 to 0.175 atom percent of arsenic in gold.

2. A mask according to claim 1 wherein said absorbing layer is from 0.6 to 0.7 μm thick.

3. A mask according to claim 2 wherein said X-ray transparent substrate comprises polyimide.

4. An X-ray mask comprising:
   (a) an X-ray transparent substrate; and
   (b) an X-ray absorbing layer, said absorbing layer comprising gold of mean grain size from 0.3 μm to 1.5 μm.

5. A mask according to claim 4 wherein said substrate comprises polyimide.

6. A mask according to claim 4 wherein said X-ray absorbing layer is from 0.6 to 0.7 μm thick.

7. A mask according to claim 4 wherein said X-ray absorbing layer comprises gold of mean grain size from 0.4 to 0.9 μm.

8. A process for creating a pattern on a substrate comprising:
   (a) providing an X-ray mask having a patterned gold surface comprising a mixture of from 0.080 to 0.175 atom percent of arsenic in gold;
   (b) aligning said mask on said substrate, said substrate being coated with an X-ray sensitive resist;
   (c) exposing said mask and resist to a beam of X-rays; and
   (d) developing said resist.

9. A process for creating a pattern on a substrate comprising:
   (a) providing an X-ray mask having a patterned gold surface wherein said gold is of mean grain size from 0.3 μm to 1.5 μm;
   (b) aligning said mask on said substrate, said substrate being coated with an X-ray sensitive resist;
   (c) exposing said mask and resist to a beam of X-rays; and
   (d) developing said resist.

* * * * *